United States Patent [19]

Opaskar et al.

[11] Patent Number: 4,582,576
[45] Date of Patent: Apr. 15, 1986

[54] PLATING BATH AND METHOD FOR ELECTROPLATING TIN AND/OR LEAD

[75] Inventors: Vince Opaskar, Cleveland Hts.; Valerie Canaris, Parma; William J. Willis, North Royalton, all of Ohio

[73] Assignee: McGean-Rohco, Inc., Cleveland, Ohio

[21] Appl. No.: 716,260

[22] Filed: Mar. 26, 1985

[51] Int. Cl.$^4$ .................................................. C25D 3/58
[52] U.S. Cl. ..................................... 204/44.4; 204/53; 204/54 R; 106/1.22; 106/1.25
[58] Field of Search .................... 204/44.4, 53, 54 R, 204/114; 106/1.22, 1.25

[56] References Cited

U.S. PATENT DOCUMENTS

| | | | |
|---|---|---|---|
| 774,049 | 11/1904 | Diamant | 204/83 |
| 2,313,371 | 3/1943 | Stack et al. | 204/54 |
| 2,525,942 | 10/1950 | Proell | 204/45 |
| 3,785,939 | 1/1974 | Hsu | 204/43 S |
| 3,875,029 | 4/1975 | Rosenberg et al. | 204/43 S |
| 3,905,878 | 10/1973 | Dohi et al. | 204/54 R |
| 3,984,291 | 10/1976 | Lerner et al. | 204/43 S |
| 4,132,610 | 1/1979 | Dohi et al. | 204/43 S |
| 4,459,185 | 7/1984 | Obata et al. | 204/53 |

Primary Examiner—R. L. Andrews
Attorney, Agent, or Firm—Renner, Otto, Boisselle & Lyon

[57] ABSTRACT

An aqueous acidic plating bath for electrodeposition of tin, lead or tin-lead alloys on a substrate is described. The plating baths are free of fluoborate and comprise (a) at least one bath-soluble metal salt selected from the group consisting of a stannous salt, a lead salt, or a mixture of stannous and lead salts, (b) at least one alkane sulfonic acid or alkanolsulfonic acid, (c) at least one nonionic, cationic or amphoteric surfactant, (d) an effective amount of at least one primary brightening agent selected from the group consisting of aromatic aldehydes, acetophenones, and carbonyl compounds having the general formula

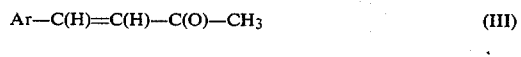

$$\text{Ar—C(H)=C(H)—C(O)—CH}_3 \qquad \text{(III)}$$

wherein Ar is a phenyl, naphthyl, pyridyl, thiophenyl or furyl group, and (e) an effective amount of a secondary brightening agent selected from the group consisting of lower aliphatic aldehydes and substituted olefins of the formula

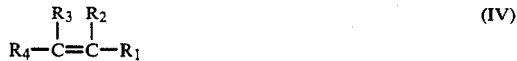

$$\begin{array}{c} R_3 \ \ R_2 \\ | \ \ \ | \\ R_4\text{—C=C—}R_1 \end{array} \qquad \text{(IV)}$$

wherein $R_1$ is a carboxy, carboxamide, alkali metal carboxylate, ammonium carboxylate, amine carboxylate or allyl carboxylate, and $R_2$, $R_3$ an $R_4$ are each independently hydrogen or lower alkyl groups. Methods for the electrodeposition of tin, lead, or tin-lead alloys from such baths also are described.

19 Claims, No Drawings

PLATING BATH AND METHOD FOR ELECTROPLATING TIN AND/OR LEAD

BACKGROUND OF THE INVENTION

This invention relates to the electrodeposition of tin, lead, and tin-lead alloys, and particularly to a plating bath which is free of fluoborates and which deposits smooth, level and bright tin and/or lead coatings.

Aqueous acidic plating baths for depositing tin and-/or lead coatings on substrates have been known in the art, and most of these baths contain, in addition to the water-soluble tin and/or lead salt, fluoborates, fluosilicates, sulfates, sulfamates, etc. Plating baths containing fluoborate have been used widely to permit high-speed, uniform metal plating of tin, lead or tin-lead alloys. However, baths containing fluoborates generally are quite corrosive and toxic requiring special equipment which is expensive and presents difficulties in operation, including the disposal of waste water.

In addition to the basic ingredients, the prior art has suggested improvements in tin and/or lead plating baths by including additives which will improve on the brightness of the deposit obtained from such baths. For example, in U.S. Pat. No. 3,875,029, the use of naphthalene monocarboxaldehyde either alone or in combination with certain substituted olefins described in the patent results in an improvement in the brightness of the deposit. Other ingredients which have been suggested as being useful additives in tin and/or lead plating baths include various combinations of aldehydes, ketones, nonionic surfactants, and amines. The plating bath described in U.S. Pat. No. 3,785,939 for producing bright deposits of tin-lead alloys comprises a combination of a nonionic polyoxyalkylated surfactant, a lower aliphatic aldehyde, an aromatic aldehyde, and an amine.

More recently, plating bath formulations have been suggested which provide for the deposition of tin and-/or lead coatings wherein the baths contain no fluoborates. For example, U.S. Pat. No. 4,459,185 describes a plating bath which is prepared by adding one or more specified cationic, amphoteric and/or nonionic surfactants and one or more leveling agents to a principal plating bath which contains an alkane sulfonic or alkanol sulfonic acid and either a divalent tin salt or a divalent lead salt of the sulfonic acids or a mixture of these. The patentees suggest that the performance of such plating baths is comparable or even superior to plating baths containing borofluoride. The plating baths contain certain specified surfactants which may be cationic surfactants, amphoteric surfactants, or nonionic surfactants. The smoothness of the coating is improved by the synergistic effect obtained by the combination of the specified surfactants and certain leveling agents. A variety of leveling agents including benzaldehyde derivatives is described in the patent.

Tin-lead alloy plating baths including hydroxyalkyl sulfonic acids are described in U.S. Pat. No. 4,132,610. The baths do not contain fluoborates or phenol sulfonates, but do contain the reaction product of o-toluidine with acetaldehyde as a brightener.

U.S. Pat. No. 3,905,878 describes tin-lead plating baths containing at least one sulfonate salt of tin and lead as well as free phenolsulfonic acid and/or free cresolsulfonic acid. Additionally, the plating baths contain a brightening agent which is prepared by reacting an aliphatic aldehyde with an aromatic primary amine under alkaline conditions. The plating baths also contain acetaldehyde and, optionally, surface active agents.

The use of olefinic compounds as brighteners in tin and tin-lead alloy plating baths, salts of fluoboric acid or sulfuric acid, is described in U.S. Pat. No. 3,875,029. The olefinic compounds useful as brighteners are characterized by the general formula

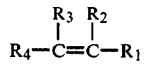

where $R_1$ is carboxy, carboxamide, alkali carboxylate, ammonium carboxylate, amine carboxylate, or alkyl carboxylate, and $R_2$, $R_3$ and $R_4$ are hydrogen, methyl, or lower alkyl. Such olefins are utilized in combination with a naphthalene monocarboxaldehyde.

U.S. Pat. No. 774,049 describes a process for electrolytically depositing lead peroxide on lead plates. The baths include a sulfonic acid or oxysulfonic acid derivative of methane and its hydroxy-substituted derivatives such as methyl sulfonic acid, methylene disulfonic acid, oxymethylene disulfonic acid, etc.

Tin or and tin and lead plating baths containing aromatic sulfones and mono- and poly-sulfonic acids of benzene, phenol and cresol are described in U.S. Pat. No. 2,313,371 and British Pat. No. 555,929. The aromatic sulfonic acids form soluble salts of tin and lead, and the disulfonic acids are particularly preferred because they provide extremely soluble salts.

U.S. Pat. No. 3,984,291 describes a plating bath which does not contain any fluoride or fluoborate. These plating baths are based on pyrophosphate and Rochelle salts. The bath is prepared, for example, by dissolving stannous pyrophosphate, potassium pyrophosphate and Rochelle salts (NaK tartrate) together with a lead salt such as lead tartrate or lead pyrophosphate in water. Generally, these types of electrolytic baths are operated at a pH of from 8.0 to 10.

Electroplating baths containing an alkane sulfonate ion wherein the alkyl group contains between 1 and 5 carbon atoms are described in U.S. Pat. No. 2,525,942. The sulfonate ions are the principal or sole anions in the plating bath. The metallic ions contained in the electrochemical baths may be lead, nickel, chromium, copper, zinc, iron, cobalt, cadmium and silver. The baths are described as being especially suitable for the electroplating of lead and nickel.

SUMMARY OF THE INVENTION

It now has been found that a smooth, level and bright deposit of tin, lead or tin-lead alloy can be deposited on a substrate from an aqueous plating bath which contains no fluoride or fluoborates. The aqueous plating baths of the invention comprise (a) at least one bath-soluble metal salt selected from the group consisting of a stannous salt, a lead salt, or a mixture of stannous and lead salts, (b) at least one alkane sulfonic acid or alkanolsulfonic acid, (c) at least one nonionic, cationic or amphoteric surfactant, (d) an effective amount of at least one primary brightening agent selected from the group consisting of aromatic aldehydes, acetophenones, and carbonyl compounds having the general formula $$Ar-C(H)=C(H)-C(O)-CH_3 \qquad (III)$$

wherein Ar is a phenyl, naphthyl, pyridyl, thiophenyl or furyl group, and (e) an effective amount of a secondary brightening agent selected from the group consisting of lower aliphatic aldehydes and substituted olefins of the formula $$R_4—C=C—R_1 \quad \text{with substituents } R_3, R_2 \quad (IV)$$

wherein $R_1$ is a carboxy, carboxamide, alkali metal carboxylate, ammonium carboxylate, amine carboxylate or allyl carboxylate, and $R_2$, $R_3$ and $R_4$ are each independently hydrogen or lower alkyl groups.

DESCRIPTION OF THE PREFERRED EMBODIMENTS

The plating baths of the present invention comprise a mixture of tin ions, lead ions, or a mixture of tin and lead ions, at least one alkane sulfonic acid or alkanol sulfonic acid, at least one surfactant, at least one primary brightening agent and at least one secondary brightening agent. Generally, the plating baths of the present invention will comprise a mixture of the free sulfonic acid with the tin, lead, or a mixture of tin and lead salts of the sulfonic acids, which salts are soluble in the plating baths.

The alkane sulfonic acids that can be utilized in the present invention have the following formula $$RSO_3H \quad (I)$$

wherein R is an alkyl group containing from about 1 to about 12 carbon atoms and more preferably, from about 1 to 6 carbon atoms. Examples of such alkane sulfonic acids include, for example, methane sulfonic acid, ethane sulfonic acid, propane sulfonic acid, 2-propane sulfonic acid, butane sulfonic acid, 2-butane sulfonic acid, pentane sulfonic acid, hexane sulfonic acid, decane sulfonic acid and dodecane sulfonic acid. The individual alkane sulfonic acids or mixtures of any of the above alkane sulfonic acids can be utilized in the plating baths of the invention.

The alkanol sulfonic acids which are useful in the present invention are characterized by the following formula $$C_nH_{2n+1}—CH—(CH_2)_m—SO_3H \quad (II)$$
$$\phantom{C_nH_{2n+1}—}OH$$

wherein n is from 0 to about 10, m is from 1 to about 11 and the sum of m+n is up to about 12. As can be seen from the above formula II, the hydroxy group may be a terminal or internal hydroxy group. Examples of useful alkanol sulfonic acids include 2-hydroxy ethyl-1-sulfonic acid, 1-hydroxy propyl-2-sulfonic acid, 2-hydroxy propyl-1-sulfonic acid, 3-hydroxy propyl-1-sulfonic acid, 2-hydroxy butyl-1-sulfonic acid, 4-hydroxy butyl-1-sulfonic acid, 2-hydroxy-pentyl-1-sulfonic acid, 4-hydroxy-pentyl-1-sulfonic acid, 2-hydroxy-hexyl-1-sulfonic acid, 2-hydroxy decyl-1-sulfonic acid, 2-hydroxy dodecyl-1-sulfonic acid.

The alkane sulfonic acids and alkanol sulfonic acids are available commercially and can also be prepared by a variety of methods known in the art. One method comprises the catalytic oxidation of mercaptans or aliphatic sulfides having the formula $R_1S_nR_2$ wherein $R_1$ or $R_2$ are alkyl groups and n is a positive integer between 1 and 6. Air or oxygen may be used as the oxidizing agent, and various nitrogen oxides can be employed as catalysts. The oxidation generally is effected at temperatures below about 150° C. Such oxidation processes are described and claimed in U.S. Pat. Nos. 2,433,395 and 2,433,396. Alternatively, chlorine can be used as the oxidizing agent.

When the plating bath is to be a tin plating bath, the bath will contain at least one alkane or alkanol sulfonic acid as described above and a tin salt thereof. Likewise, a lead plating bath contains at least one alkane or alkanol sulfonic acid and a lead salt thereof. Mixtures of said acids and salts are useful. The tin-lead alloy plating baths will contain at least one alkane or alkanol sulfonic acid and the tin and lead salts thereof. The divalent tin and divalent lead salts of alkane sulfonic acids and alkanol sulfonic acids can be readily prepared by the reaction of a divalent tin or divalent lead salt with the desired sulfonic acid. Examples of tin and lead salts which can be reacted with the sulfonic acid to form the desired metal sulfonate include the oxides of tin and lead.

The total concentration of metal ion or ions in the bath may vary over a wide range depending upon the desired properties of the plating to be deposited on the substrate. Generally, from about 0.5 to about 350 grams per liter or more of the metal ion or ions is included in the bath, and more generally, the bath will contain from about 10 to about 100 grams per liter of metal ion or ions. Obviously, when a tin deposit is desired, the lead ion should be omitted from the bath, and, conversely, when a lead deposit is desired, the tin ion is omitted from the bath.

The concentration of the free alkane or alkanol sulfonic acid (b) in the plating baths of the invention is in a range of from about 10 to about 500 grams per liter of bath, and more preferably from about 50 to about 200 grams per liter of bath.

In addition to the above components, it is necessary that the plating baths of the invention contain at least one nonionic, cationic or amphoteric surfactant. A variety of nonionic surfactants which can be utilized in the present invention are the condensation products of ethylene oxide and/or propylene oxide with compounds containing a hydroxy, mercapto or amino group containing at least one N—H. Examples of materials containing hydroxyl groups include alkyl phenols, styrenated phenols, fatty alcohols, fatty acids, polyalkalene glycols, etc. Examples of materials containing amino groups include alkylamines and polyamines, fatty acid amides, etc.

Examples of nonionic surfactants useful in the plating baths of the invention include ether containing surfactants having the formula $$R—O—[(CH_2)_nO]_xH \quad (A)$$

wherein R is an aryl or alkyl group containing from about 6 to 20 carbon atoms, n is two or three, and x is an integer between 2 and 100. Such surfactants are produced generally by treating fatty alcohols or alkyl or alkoxy substituted phenols or naphthols with excess ethylene oxide or propylene oxide. The alkyl carbon chain may contain from about 14 to 24 carbon atoms and may be derived from a long chain fatty alcohol such as oleyl alcohol or stearyl alcohol.

Nonionic polyoxyethylene compounds of this type are described in U.S. Pat. No. 3,855,085. Such polyoxyethylene compounds are available commercially under the general trade designations "Surfynol" by Air Products and Chemicals, Inc. of Wayne, Pa., and under the designation "Pluronic" or "Tetronic" by BASF Wyandotte Corp. of Wyandotte, Mich. Examples of specific polyoxyethylene condensation products useful in the invention include "Surfynol 465" which is a product obtained by reacting about 10 moles of ethylene oxide with 1 mole of tetramethyldecynediol. "Surfynol 485" is the product obtained by reacting 30 moles of ethylene oxide with tetramethyldecynediol. "Pluronic L 35" is a product obtained by reacting 22 moles of ethylene oxide with polypropylene glycol obtained by the condensation of 16 moles of propylene oxide.

Alkoxylated amine, long chain fatty amine, long chain fatty acid, alkanol amines, diamines, amides, alkanol amides and polyglycol-type surfactants known in the art are also useful. One type of amine surfactant found particularly useful in a tin or lead plating bath is the group obtained by the addition of a mixture of propylene oxide and ethylene oxide to diamines. More specifically, compounds formed by the addition of propylene oxide to ethylene diamine followed by the addition of ethylene oxide are useful and are available commercially from BASF Wyandotte Ind. Chemical Group under the general trade designation "Tetronic".

Carbowax-type surfactants which are polyethylene glycols having different molecular weights also are useful. For example Carbowax No. 1000 has a molecular weight range of from about 950 to 1,050 and contains from 20 to 24 ethoxy units per molecule. Carboxwax No. 4000 has a molecular weight range of from about 3000 to 3700 and contains from 68 to 85 ethoxy units per molecule. Other known nonionic glycol derivatives such as polyalkylene glycol ethers and methoxy polyethylene glycols which are available commercially can be utilized as surfactants in the compositions of the invention.

Ethylene oxide condensation products with fatty acids also are useful non-ionic surfactants. Many of these are available commercially such as under the general tradename "Ethofat" from Armak Ind. Examples include condensate of coco acids, oleic acid, etc. Ethylene oxide condensates of fatty acid amides, e.g. oleamide, also are available from Armak Ind.

In some of the baths, improved results are obtained when polyoxyalkylated glycols, phenols and/or naphthols are included. For example ethylene oxide and propylene oxide condensates with aliphatic alcohols, sorbitan alkyl esters, alkyl, alkoxy and styrenated phenols and naphthols are useful additives. About 6 to about 40 moles of the oxide may be condensed with the above identified compounds. Many of these condensates are available commercially under such trade names as "Tween" from ICI America, "Triton" from Rohm & Haas Co., "Tergitol" from Union Carbide, and "Igepal" from General Aniline and Film Corp.

The surfactants utilized in the plating baths of the present invention may be amphoteric surfactants. The preferred amphoteric surfactants include betaines and sulfobetaines, and sulfated or sulfonated adducts of the condensation products of ethylene oxide and/or propylene oxide with an alkyl amine or diamine. The betaines may be represented by the general formula

wherein $R^1$ is an alkyl group containing from about 8 to 20 carbon atoms, and $R^2$ and $R^3$ are alkyl groups containing from 1 to about 4 carbon atoms.

Typical betaines include lauryldimethylammonium betaine and stearyl dimethylammonium betaine. Sulfated and sulfonated adducts include Triton QS-15 (Rohn & Haas Co.), a sulfated adduct of an ethoxylated alkylamine, Miranol HS, a sodium salt of a sulfonated lauric derivative, Miranol OS, a sodium salt of a sulfonated oleic acid, etc.

Cationic surfactants also are useful in the plating baths of the present invention and such surfactants may be selected from the group consisting of higher alkyl amine salts, quaternary ammonium salts, alkyl pyridinium salts and alkyl imidazolium salts.

Cationic surfactants obtained by condensation of various amounts of ethylene oxide or propylene oxide with primary fatty amines are useful and may be represented by the following formula

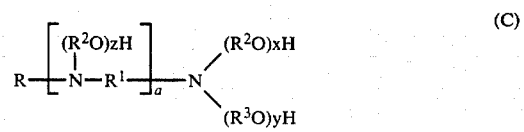

wherein

R is a fatty acid alkyl group containing from about 8 to about 22 carbon atoms, $R^1$ is an alkylene radical containing up to about 5 carbon atoms, $R^2$ and $R^3$ are each independently an ethylene or propylene group, a is 0 or 1, and x, y and z are each independently integers from 1 to about 30, and the sum of x, y, and z is an integer of from about 2 to about 50.

More particularly, the alkoxylated amines utilized in the baths of the invention are represented by the formulas D and E

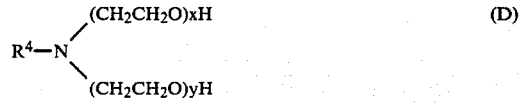

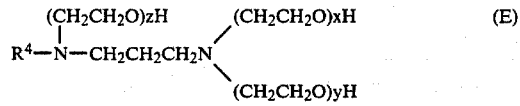

wherein $R^4$ is a fatty acid alkyl group containing from 12 to 18 carbon atoms, and x, y and z are as defined in formula C.

The above described cationic surfactants are known in the art and are available from a variety of commercial sources. The surfactants of the type represented by formula D can be prepared by condensing various amounts of ethylene oxide with primary fatty amines which may be a single amine or a mixture of amines such as are obtained by the hydrolysis of tallow oils, sperm oils, coconut oils, etc. Specific examples of fatty acid amines containing from 8 to 22 carbon atoms include saturated as well as unsaturated aliphatic amines such as octyl amine, decyl amine, lauryl amine, stearyl amine, oleyl amine, myristyl amine, palmityl amine, dodecyl amine, and octadecyl amine.

The alkoxylated amines which are useful in the plating baths of the invention can be prepared as mentioned above, by condensing alkylene oxides with the above-described primary amines by techniques known to those in the art. A number of such alkoxylated amines is commercially available from a variety of sources.

The above described amines can be prepared, as mentioned above, by condensing alkylene oxides with the above-described primary amines by techniques known to those in the art. A number of such alkoxylated amines is commercially available from a variety of sources. The alkoxylated amines of the type represented by formula B are available from the Armak Chemical Division of Akzona, Inc., Chicago, Ill., under the general trade designation "Ethomeen". Specific examples of such products include "Ethomeen C/15" which is an ethylene oxide condensate of a coconut fatty amine containing about 5 moles of ethylene oxide; "Ethomeen C/20" and "C/25" which also are ethylene oxide condensation products from coconut fatty amine containing about 10 and 15 moles of ethylene oxide respectively; "Ethomeen S/15" and "S/20" which are ethylene oxide condensation products with stearyl amine containing about 5 and 10 moles of ethylene oxide per mole of amine respectively; and "Ethomeen T/15" and "T/25" which are ethylene oxide condensation products of tallow amine containing about 5 and 15 moles of ethylene oxide per mole of amine respectively. Commercially available examples of the alkoxylated amines of the type represented by formula C include "Ethoduomeen I/13" and "T/20" which are ethylene oxide condensation products of N-tallow trimethylene diamine containing about 3 and 10 moles of ethylene oxide per mole of diamine respectively.

The cationic surfactant also may be a quaternary ammonium salt of the formula

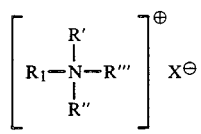
(F)

wherein X represents a halogen, a hydroxyl group, or the residue of a $C_{1-5}$ alkanesulfonic acid; $R_1$ represents a $C_{8-20}$ alkyl group; R' and R" represent a $C_{1-4}$ alkyl group; and R''' represents a $C_{1-10}$ alkyl group or a benzyl group; pyridinium salts represented by the general formula (G)

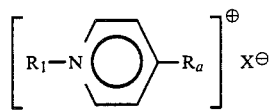
(G)

wherein X represents a halogen, a hydroxyl group, or the residue of a $C_{1-5}$ alkanesulfonic acid; $R_1$ represents a $C_{8-20}$ alkyl group; and $R_a$ represents hydrogen or a $C_{1-4}$ alkyl group; imidazolinium salts represented by the general formula H

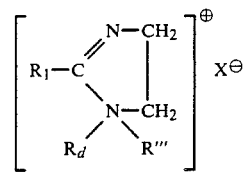
(H)

wherein X represents a halogen, a hydroxyl group, or the residue of a $C_{1-10}$ alkanesulfonic acid; $R_1$ represents a $C_{8-20}$ alkyl group; $R_d$ represents a hydroxy-containing $C_{1-5}$ alkyl group; and R''' represents a $C_{1-10}$ alkyl group or a benzyl group; and higher alkyl amine salts represented by the general formula (I)

$$[R_1-NH_3]^{\oplus}CH_3-(CH_2)_n-COO^{\ominus} \quad (I)$$

wherein $R_1$ represents a $C_{8-20}$ alkyl group; and n is from about 0 to about 4.

Examples of the above described cationic surfactants, in the form of salts, are lauryltrimethylammonium salt, cetyltrimethylammonium salt, stearyltrimethylammonium salt, lauryldimethylethylammmonium salt, octadecyldimethylethylammonium salt, dimethylbenzyllaurylammonium salt, cetyldimethylbenzylammonium salt, octadecyldimethylbenzylammonium salt, trimethylbenzylammonium salt, triethylbenzylammonium salt, hexadecylpyridinium salt, laurylpyridinium salt, dodecylpicolinium salt, 1-hydroxyethyl-1-benzyl-2-laurylimidazolinium salt, 1-hydroxyethyl-1-benzyl-2-oleylimidazolinium salt, stearylamine acetate, laurylamine acetate, and octadecylamine acetate.

The surfactants described above may be used in the plating baths of the present invention in a concentration of from about 0.01 to about 50 grams per liter of bath and more preferably from about 0.05 to about 20 grams per liter of bath.

Plating baths of the present invention also contain an effective amount of at least one primary brightening agent which generally are aromatic aldehydes or ketones. The primary brightening agents are selected from the group consisting of aromatic aldehydes, acetophenones, and carbonyl compounds having the general formula $$Ar-C(H)=C(H)-C(O)-CH_3 \quad III$$

wherein Ar is a phenyl, naphthyl, pyridyl, thiophenyl or furyl group.

The aromatic aldehydes may be the benzaldehydes, naphthaldehydes, pyridinecarboxaldehydes, thiophenecarboxaldehydes and furaldehydes.

Benzaldehydes include the derivatives represented by the formula

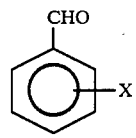
(J)

wherein X is hydrogen or a nitro, halo, amino, alkoxy or lower alkyl group. Specific examples of benzaldehydes include benzaldehyde, o-chlorobenzaldehyde, tolualdehyde, cinnamaldehyde and anisaldehyde.

The naphthaldehydes may be substituted or unsubstituted 1-naphthaldehydes and 2-naphthaldehydes as represented by the following formula K

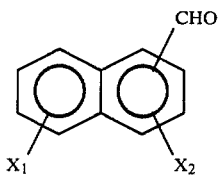  (K)

wherein $X_1$ and $X_2$ are independently hydrogen, hydroxy, alkoxy, chloro or bromo, and the alkyl group of the alkoxy group contains from about 1 to 5 carbon atoms. Specific examples of such naphthaldehydes include 1-naphthaldehyde, 2-naphthaldehyde, 2-methoxy-1-naphthaldehyde, 2-hydroxy-1-naphthaldehyde, 2-ethoxy-1-naphthaldehyde, 4-methoxy-1-naphthaldehyde, 4-ethoxy-1-naphthaldehyde, 4-hydroxy-1-naphthaldehyde, 2-chloro-1-naphthaldehyde, 4-chloro-1-naphthaldehyde, etc.

The pyridinecarboxaldehydes which can be utilized as the primary brightening agents may be represented by the formula L

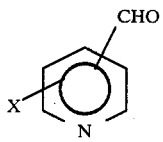  (L)

wherein X is hydrogen, hydroxy, alkoxy, chloro, or bromo, and the alkyl group of the alkoxy group contains from 1 to 5 carbon atoms. Specific examples of such aldehydes include pyridine-2-carboxaldehyde, pyridine-3-carboxaldehyde, pyridine-4-carboxaldehyde, 6-methoxy-pryidine-2-carboxaldehyde.

The thiophenecarboxaldehydes which can be utilized in the plating baths of the invention may be represented by the following formula M

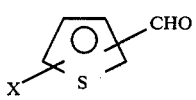  (M)

wherein X is as defined above for formula L. Specific examples of such carboxaldehydes include 2-thiophenecarboxaldehyde, 3-thiophenecarboxaldehyde, etc.

The furaldehydes which can be utilized in the present invention include those represented by the following general formula N

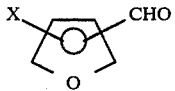  (N)

wherein X is as defined above for formula L. Specific examples of such furaldehydes include 2-furaldehyde and 3-furaldehyde.

The primary brightening agent utilized in the plating baths of the present invention also may be one or more acetophenones characterized by the following formula O

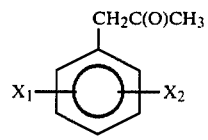  (O)

wherein $X_1$ and $X_2$ are each independently hydrogen and chlorine. Examples of such compounds are acetophenone and 3',4'-dichloroacetophenone.

In another preferred embodiment, the primary brightening agent is a carbonyl compound having the formula $$Ar-C(H)=C(H)-C(O)CH_3 \qquad III$$

wherein Ar is phenyl, naphthyl, pyridyl, thiophenyl or furyl group.

When Ar is a phenyl group, the carbonyl compound can be represented by the general formula P

  (P)

wherein $X_1$ and $X_2$ may be hydrogen, hydroxyl, alkoxy, chlorine or bromine, and the alkyl group of the alkoxy group may contain from about 1 to about 5 carbon atoms. Examples of such compounds include benzylidine acetone and 3'-chlorobenzylidine acetone.

Carbonyl compounds of the type represented by formula III wherein Ar is a naphthyl group can be represented by the following formula Q

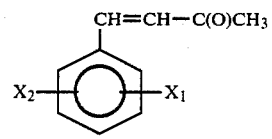  (Q)

wherein $X_1$ and $X_2$ are as defined above for formula P. A specific example of such brighteners is 4(1-naphthyl)-3-butene-2-one.

The pyridyl, thiophenyl and furyl containing carbonyl compounds of the type represented by formulas R, S and T

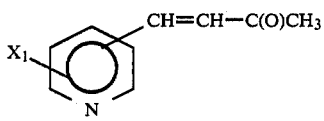  (R)

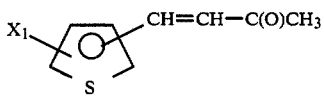  (S)

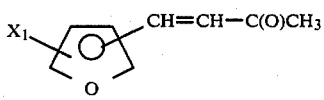  (T)

wherein $X_1$ is as defined above for formula P. Specific examples of such carbonyl compounds include 4-(2-furyl)-3-butene-2-one, 4-(pyridyl-2-)-3-butene-2-one, and 4-(thiophenyl-2-)-3-butene-2-one.

The amount of the above described primary brightening agents utilized in the plating baths of the present invention can range from about 0.05 to about 5 grams per liter of bath and more generally is within the range of from about 0.2 to about 1 gram per liter of plating bath.

In addition to the primary brightening agent, the plating baths of the present invention also contain (E) an effective amount of a secondary brightening agent from the group consisting of low aliphatic aldehydes and substituted olefins of the formula

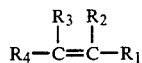

$$R_4-\underset{\underset{R_3}{|}}{C}=\underset{\underset{R_2}{|}}{C}-R_1 \qquad (IV)$$

wherein $R_1$ is a carboxy, carboxamide, alkali metal carboxylate, ammonium carboxylate, amine carboxylate or allyl carboxylate, and $R_2$, $R_3$ and $R_4$ are each independently hydrogen or lower alkyl groups.

The aliphatic aldehydes which are useful as a seondary brightening agent preferably will be a lower aliphatic aldehyde containing up to about 6 carbon atoms, and the aliphatic group may be either saturated or unsaturated. Examples of such aldehydes include formaldehyde, acetaldehyde, paraldehyde, butyraldehyde, propionaldehyde, acrolein, crotonaldehyde and 3-hydroxy-butanal.

In a preferred embodiment, the olefinic compounds represented by IV are alpha unsaturated carboxylic acids, amides or esters. Examples of such materials include acrylic acid, methacrylic acid, methyl acrylate, methyl methacrylate, ethacrylic acid, ethyl acrylate, acrylamide, methacrylamide, crotonic acid, cinnamic acid, butyl methacrylate, etc. These alpha unsaturated compounds generally are added to the plating bath as aqueous or alocholic (e.g., methyl, ethyl, propyl and isopropyl alcohol) solutions to ensure good dispersion in the plating bath.

The amount of secondary brightening agents (E) utilized in the plating baths of the present invention may range from about 0.1 to about 20 grams per liter of bath and more generally range from about 0.5 to about 10 grams per liter of the plating bath.

The tin, lead, and tin-lead plating baths of the present invention which contain no fluoride or fluoborate ions deposit a bright level coating of the metal or alloy on substrates at any conventional temperature used or normally used with tin and/or lead plating baths, and over a wide current density range. The following examples illustrate the plating baths of the invention. Unless otherwise indicated in the following examples and elsewhere in the specification and claims, all parts and percentages are by weight, and temperatures are in °C.

EXAMPLE 1

An aqueous plating bath is prepared by mixing with water, sufficient quantities of stannous methane sulfonate to provide 20 g/l of stannous ion, 100 g/l of free methane sulfonic acid, 5 g/l of nonionic surfactant which is nonylphenol condensed with 10 moles of ethylene oxide, 1 g/l of methyl methacrylate, and 0.2 g/l of benzylidine acetone.

Additional plating baths were prepared in accordance with the present invention following the general procedure of Example 1.

EXAMPLE 2

|  | g/l |
|---|---|
| Stannous ion (added as the stannous 2-hydroxypropane sulfonate | 20 |
| Free 2-hydroxypropane sulfonic acid | 90 |
| Texaco 315-Ethylene diamine which has been propoxylated followed by condensation with ethylene oxide | 10 |
| Methacrylic Acid | 0.5 |
| 2-Hydroxy-1-naphthaldehyde | 0.06 |
| Water | to make 1 liter |

EXAMPLE 3

| Stannous ion (added as stannous ethane sulfonate) | 18 |
|---|---|
| Plumbous ion (added as plumbous ethane sulfonate) | 3 |
| Free ethane sulfonic acid | 100 |
| naphthol condensed with 12 moles ethylene oxide | 6 |
| Paraldehyde | 15 |
| 2-Naphthaldehyde | 0.2 |
| Water | to make 1 liter |

EXAMPLE 4

| Divalent tin (added as stannous methane sulfonate) | 18 |
|---|---|
| Divalent lead (added as plumbous methane sulfonate | 3 |
| Free methane sulfonic acid | 100 |
| Amidox C-5 (ethoxylated fatty acid amide) | 10 |
| Crotonaldehyde | 3 |
| 3',4'-dichloroacetophenone | 0.5 |
| Water | to make 1 liter |

EXAMPLE 5

| Stannous ion (added as stannous hydroxy ethane sulfonate) | 18 |
|---|---|
| Plumbous ion (added as plumbous hydroxy ethane sulfonate) | 3 |
| Free hydroxy ethane sulfonate | 120 |
| Surfynol 485 (an ethoxylated tetramethyldecyne diol) | 5 |
| Methacrylamide | 2 |
| 4-(2-furyl)-3-butene-2-one | 1 |
| Water | to make 1 liter |

EXAMPLE 6

| Stannous ion (added as stannous methane sulfonate) | 18 |
|---|---|
| Plumbous ion (added as plumbous methane sulfonate) | 3 |
| Free methane sulfonic acid | 100 |
| Brij 58 (Cetyl alcohol condensed with 20 moles ethylene oxide) | 5 |
| Alkateryl T (Cationic, a substituted oxyaline) | 1 |
| Acrylic acid | 1.5 |
| 2-methoxynaphthaldehyde | 0.1 |

EXAMPLE 7

| | |
|---|---|
| Divalent tin (added as stannous hydroxy propylsulfonate) | 18 |
| Divalent lead (added as plumbous hydroxy propylsulfonate) | 9 |
| Free hydroxy propylene sulfonic acid | 80 |
| Pluronic L-44 (an ethylene oxide condensate with a hydrophobic base of polypropylene glycol) | 4 |
| Igepal CO-610 [nonylphenoxypoly(ethylenoxy)ethanol] | 4 |
| Formaldehyde (added as 37% aq. sol'n) | 10 |
| 4(1-naphthyl)-3-butene-2-one | 0.5 |
| Water | to make 1 liter |

EXAMPLE 8

| | |
|---|---|
| Divalent tin (added as stannous methane sulfonate) | 18 |
| Divalent lead (added as plumbous methane sulfonate) | 9 |
| Free methane sulfonic acid | 100 |
| Triton QS-15 (A sulfated adduct of an ethoxylated alkylamine) | 6 |
| Methyl acrylate | 2 |
| 3'-chloroacetophenone | 0.2 |
| 2-naphthaldehyde | 0.1 |
| Water | to make 1 liter |

EXAMPLE 9

| | |
|---|---|
| Divalent tin (added as stannous hydroxy ethane sulfonate) | 18 |
| Divalent lead (added as plumbous hydroxy ethane sulfonate) | 3 |
| Free hydroxy ethane sulfonic acid | 120 |
| Ethomeen S-20 (Ethylene oxide condensate with stearyl amine) | 4 |
| Dimethyl benzyl lauryl ammonium methane sulfonate | 3 |
| Acrylamide | 3 |
| 4(hydroxy-3-methoxy phenyl)-3-butene-2-one | 0.4 |
| Water | to make 1 liter |

EXAMPLE 10

| | |
|---|---|
| Divalent tin (added as stannous methane sufonate) | 20 |
| Free methane sulfonic acid | 100 |
| Triton N-101 (ethoxylated nonyl phenol) | 3 |
| Miranol HS (sodium salt of sulfonated lauric derivative) | 2 |
| Crotonic acid | 2 |
| 4-(pyridyl-2-)-3-butene-2-one | 0.3 |
| Water | to make 1 liter |

EXAMPLE 11

| | |
|---|---|
| Divalent tin (added as stannous hydroxy propyl sulfonate) | 18 |
| Divalent lead (added as plumbous hydroxy propyl sulfonate) | 3 |
| Free hydroxy propane sulfonic acid | 120 |
| Priminox R-15 (ethoxylated tertiary amine) | 10 |
| Ethyl acrylate | 1 |
| 2-thiophenylcarboxaldehyde | 0.2 |
| Water | to make 1 liter |

EXAMPLE 12

| | |
|---|---|
| Divalent tin (added as stannous methane sulfonate) | 18 |
| Divalent lead (added as plumbous methane sulfonate) | 3 |
| TDG-1290 (ethylene oxide condensate with mercapto ethanol) | 2 |
| Ethofat 0-20 (ethylene oxide condensate of a fatty acid) | 1 |
| Paraldehyde | 8 |
| 3-pyridinecarboxaldehyde | 0.4 |
| Water | to make 1 liter |

The utility of the plating baths of the present invention in depositing tin and tin-lead coatings is demonstrated by conducting plating tests in standard 267 ml Hull cells using as the anode, a tin or tin-lead alloy (60/40, tin/lead). Steel panels are plated at a current of 2 amps for a period of five minutes. Mechanical bath agitation is employed, and the bath temperature is maintained at about 20° to about 25° C. The results of the plating tests are summarized in the following Table.

TABLE

| Example # | Bath | Appearance of Hull Cell Panel* |
|---|---|---|
| 1 | Sn | G |
| 2 | Sn | VG |
| 3 | 90/10 | G |
| 4 | 90/10 | G |
| 5 | 90/10 | A |
| 6 | 90/10 | G |
| 7 | 60/40 | A |
| 8 | 60/40 | G |
| 9 | 90/10 | G |
| 10 | Sn | A |
| 11 | 90/10 | G |
| 12 | 90/10 | G |

*(VG)Very Good-An electrodeposit which is bright over most of the Hull cell panel.
(G)Good-The deposit is mostly bright but somewhat hazy at certain current densities.
(A)Acceptable-The deposit is semibright to bright over limited current densities.

In practice, the improved tin, lead, and tin-lead alloy plating baths containing the brightener compositions of the invention may be operated on a continuous or intermittent basis, and from time to time, components of the bath have to be replenished. The various components may be added singularly as required or may be added in combination. The amounts of the various additive compositions to be added to the plating baths may be varied over a wide range depending on the nature and performance of the plating bath to which the composition is added. Such amounts can be determined readily by one skilled in the art.

As mentioned above, the major advantage of the plating baths of the present invention is that they contain no fluoride or fluoborate ions which eliminates the need for the recovery and disposal of these undesirable ions. The fluoride and fluoborate ions are undesirable because of the environmental pollution problems created on disposal, and further because of their corrosive nature when present in plating baths. The plating baths of the present invention which do not contain fluoride or fluoborate ions are less corrosive to machinery and glass parts, and also permit the use of titanium and titanium alloy anode baskets. It also has been observed that anode dissolution is improved in the plating baths of the present invention which results in less anode polarization and a reduced amount of stannate tin in the bath.

The coatings deposited from the plating baths of the invention are useful in electronic circuits, electronic devices and electrical connectors. The surface layers of tin, lead and tin-lead alloys can be used as protective layers to prevent corrosion or in a patterning procedure during the fabrication of printed circuits or integrated circuits. The coatings also provide chemically stable surfaces for soldering on printed wire boards, etc.

Having best described the invention in full, clear, concise, and exact terms as to enable any person skilled in the art to which it pertains to make and use the invention, and having set forth the best modes contemplated of carrying out the invention, it should be understood that equivalents or substitutions for parts of the above specifically described embodiments of the invention may be made without departing from the scope and concept of the invention.

The embodiments of the invention in which an exclusive property or privilege is claimed are defined as follows:

1. An aqueous tin, lead, or tin-lead alloy plating bath free of fluoride and fluoborates comprising
   (A) at least one bath-soluble metal salt selected from the group consisting of a stannous salt, a lead salt, or a mixture of stannous and lead salts,
   (B) at least one alkane sulfonic acid or alkanol sulfonic acid,
   (C) at least one nonionic, cationic or amphoteric surfactant,
   (D) an effective amount of at least one primary brightening agent selected from the group consisting of aromatic aldehydes, acetophenones, and carbonyl compounds having the general formula $$Ar-C(H)=C(H)-C(O)-CH_3 \qquad (III)$$

wherein Ar is a phenyl, naphthyl, pyridyl, thiophenyl or furyl group, and
   (E) an effective amount of a secondary brightening agent selected from the group consisting of lower aliphatic aldehydes and substituted olefins of the formula

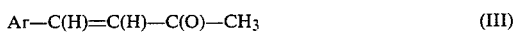

wherein $R_1$ is a carboxy, carboxamide, alkali metal carboxylate, ammonium carboxylate, amine carboxylate or allyl carboxylate, and $R_2$, $R_3$ and $R_4$ are each independently hydrogen or lower alkyl groups.

2. The plating bath of claim 1 wherein the bath-soluble metal salts (A) comprise the salts of at least one alkane sulfonic acid or alkanol sulfonic acid and mixtures thereof.

3. The plating bath of claim 1 wherein the alkane sulfonic acid and alkanol sulfonic acid are characterized by the following formulae $$RSO_3H \qquad (I)$$

$$C_nH_{2n+1}-\underset{\underset{OH}{|}}{CH}-(CH_2)_m-SO_3H \qquad (II)$$

respectively where R is an aliphatic group containing from 1 to about 12 carbon atoms, n is from 0 to about 10, m is from 1 to about 11, and the sum of m+n is up to about 12.

4. The plating bath of claim 1 wherein the primary brightening agent is naphthaldehyde.

5. The plating bath of claim 1 wherein the primary brightening agent is a benzylidine acetone.

6. The plating bath of claim 1 wherein the secondary brightening agent is a lower aliphatic aldehyde.

7. The plating bath of claim 1 wherein the secondary brightening agent is a substituted olefin of Formula IV wherein $R_1$ is a carboxy group and $R_2$, $R_3$ and $R_4$ are each independently hydrogen or lower alkyl groups.

8. An aqueous plating bath for electrodeposition of a tin, lead or tin-lead alloy, which plating bath is free of fluoride and fluoborates and comprises
   (A) from about 0.5 to about 350 grams per liter of at least one stannous ion, lead ion or mixture of stannous and lead ions
   (B) from about 10 to about 500 grams per liter of at least one alkane sulfonic acid having the general formula $$RSO_3H \qquad (I)$$

or an alkanol sulfonic acid of the general formula $$C_nH_{2n+1}-\underset{\underset{OH}{|}}{CH}-(CH_2)_m-SO_3H \qquad (II)$$

wherein R is an aliphatic group containing from 1 to about 6 carbon atoms, n is from 0 to about 10, m is from 1 to about 11 and the sum of m+n is up to about 12,
   (C) from about 0.01 to about 50 grams per liter of at least one nonionic, cationic or amphoteric surfactant,
   (D) an effective amount of at least one primary brightening agent selected from the group consisting of naphthaldehyde and carbonyl compounds having the general formula $$Ar-C(H)=C(H)-C(O)-CH_3 \qquad (III)$$

wherein Ar is a phenyl, naphthyl, pyridyl, thiophenyl or furyl group, and
   (E) an effective amount of a secondary brightening agent selected from the group consisting of lower aliphatic aldehydes and substituted olefins of the formula

wherein $R_1$ is a carboxy, carboxamide, alkali metal carboxylate, ammonium carboxylate, amine carboxylate or allyl carboxylate, and $R_2$, $R_3$ and $R_4$ are each independently hydrogen or lower alkyl groups.

9. The plating bath of claim 8 wherein the primary brightening agent is present in an amount of from about 0.05 to about 5 grams per liter.

10. The plating bath of claim 8 wherein the secondary brightening agent is present in an amount of from about 0.1 to about 20 grams per liter.

11. The plating bath of claim 8 wherein the primary brightening agent is a naphthaldehyde.

12. The plating bath of claim 8 wherein the second primary brightening agent is a benzylidine acetone.

13. The plating bath of claim 8 wherein the secondary brightening agent is a lower aliphatic aldehyde.

14. The plating bath of claim 8 wherein the secondary brightening agent is at least one substituted olefin represented by Formula IV wherein $R_1$ is a carboxy group, and $R_2$, $R_3$ and $R_4$ are each independently hydrogen or lower alkyl groups.

15. The method of electrodepositing a bright tin, lead or tin-lead alloy on a substrate which comprises electroplating said substrate in the aqueous plating bath of claim 1.

16. The method of electrodepositing a bright tin, lead or tin-lead alloy on a substrate which comprises electroplating said substrate in the aqueous acidic plating bath of claim 8.

17. The method of claim 16 wherein the primary brighening agent is a naphthaldehyde.

18. The method of claim 16 wherein the secondary brightening agent is a lower aliphatic aldehyde.

19. The method of claim 17 wherein the secondary brightening agent is a substituted olefin of Formula IV wherein $R_1$ is a carboxylic acid or ester and $R_2$ $R_3$ and $R_4$ are each independently hydrogen or lower alkyl groups.

* * * * *